United States Patent [19]
Chan et al.

[11] Patent Number: 6,150,232
[45] Date of Patent: Nov. 21, 2000

[54] FORMATION OF LOW K DIELECTRIC

[75] Inventors: Lap Chan, San Francisco, Calif.; Cher Liang Cha; Kok Keng Ong, both of Singapore, Singapore; Kheng Chok Tee, Selangor, Malaysia

[73] Assignee: Chartered Semiconductor Manufacturing Ltd., Singapore, Singapore

[21] Appl. No.: 09/244,877

[22] Filed: Feb. 5, 1999

[51] Int. Cl.$^7$ .................................................. H01L 21/76
[52] U.S. Cl. ......................... 438/421; 438/422; 257/522
[58] Field of Search .................................. 438/421, 422, 438/619, 700; 257/522, 410

[56] References Cited

U.S. PATENT DOCUMENTS

| | | | |
|---|---|---|---|
| 5,407,860 | 4/1995 | Stoltz et al. | 437/180 |
| 5,461,003 | 10/1995 | Havemann et al. | 437/187 |
| 5,510,645 | 4/1996 | Fitch et al. | 257/522 |
| 5,750,415 | 5/1998 | Gnade et al. | 437/195 |
| 5,792,706 | 8/1998 | Michael et al. | 438/626 |
| 5,828,121 | 10/1998 | Lur et al. | 257/522 |
| 5,880,018 | 3/1999 | Boeck et al. | 438/700 |
| 6,022,802 | 2/2000 | Jang | 438/421 |
| 6,057,226 | 5/2000 | Wong | 438/421 |

*Primary Examiner*—Kevin M. Picardat
*Attorney, Agent, or Firm*—George O. Saile; Rosemary L. S. Pike

[57] ABSTRACT

A method for creating low intra-level dielectric interface between conducting lines using conventional deposition and etching processes. A layer of conducting lines is formed interspersed with dielectric material. A dummy, high-density pattern of low k dielectric material is created on top of this layer. The dielectric material between the metal lines is removed. The dummy high-density pattern is interconnected, deposited on top of this interconnected layer is a low k dielectric to form an inter layer dielectric.

54 Claims, 2 Drawing Sheets

FORMATION OF LOW K DIELECTRIC

BACKGROUND OF THE INVENTION

1. Field of the Invention

The invention relates to the fabrication of Integrated Circuit devices and more specifically to the formation of air gaps as a low dielectric constant material between conductor lines on the same or on different levels.

2. Description of the Prior Art

The formation of air gaps between conducting lines of high speed Integrated Circuits (IC's) is typically a combination of the deposition of a metal layer, selective etching of the metal layer to form the desired line patterns, the deposition of a porous dielectric layer or a disposable liquid layer which is then selectively removed to form the desired air-gaps.

The continuing effort to reduce the size of individual transistors and other devices commonly integrated on a semiconductor chip and to increase the density of Integrated Circuits results in a continuing reduction of the separation between conducting layers of materials. This reduction results in an increase of capacitive crosstalk between adjacent conductor lines of a semiconductor circuit, that is the voltage on the first conductor line alters or affects the voltage on the second conductor line. This alteration in voltage can cause erroneous voltage levels in the Integrated Circuit making the IC increasingly prone to faulty operation. It becomes therefore imperative to reduce the resistance capacitance (RC) time constant and the crosstalk between adjacent conducting lines.

The capacitance between adjacent conducting lines is highly dependent on the insulator or dielectric used to separate the conducting lines. Conventional semiconductor fabrication typically uses silicon dioxide as a dielectric; this has a dielectric constant of about 3.9.

The use of many of the low dielectric constant materials is not feasible due to the fact that equipment is not available to properly process the new dielectric material in various integrated circuits. Also, the chemical or physical properties of many low dielectric constant materials are usually difficult to make compatible with or integrate into conventional integrated circuit processing.

The lowest possible and therefore the ideal dielectric constant is 1.0, this is the dielectric constant of a vacuum whereas air has a dielectric constant of slightly larger than 1.0.

To reduce said capacitive coupling and reduce the capacitive crosstalk, a major objective in the design of IC's is to reduce the dielectric constant (k) of the insulating layer between adjacent conductor lines of semiconductor circuits. The present invention makes a significant contribution within the scope of this effort.

U.S. Pat. No. 5,461,003 (Haveman et al.) shows a method of forming air gaps between metal lines by: 1) forming a photoresist layer (disposable layer) 18 (see table 1) between and over metal lines; 2) forming a low-k dielectric (HSQ) (20 see table 1) (but not by having openings thereover); 3) removing the photoresist 18 and thereby forming air gaps and 4) by forming a capping oxide layer to close up the air gaps. However, this patent differs from the present invention in step 2).

U.S. Pat. No. 5,750,415 (Gnade et al.) U.S. Pat. No. 5,792,706 (Michael et al.) and U.S. Pat. No. 5,407,860 (Stotz et al.) show air gap processes.

SUMMARY OF THE INVENTION

The principle object of the present invention is to provide an effective and manufacturable method of forming air gaps between conductive layers of material.

Another objective of the present invention is a method of reducing the dielectric constant k between conductive layers of material.

Another objective of the present invention is a method of reducing capacitive coupling between conducting layers of material.

Another objective of the present invention is a method of reducing capacitive crosstalk between conductive layers of material.

Another objective of the present invention is to reduce the potential for false or incorrect logic levels of the circuits in the IC's.

Another objective of the present invention is a method of reducing Resistive Capacitive delays of the circuits in the IC's.

Another objective of the present invention is to increase Switching Speed of the circuits in the IC's.

Another objective of the present invention is to allow dummy blocks within the construct of the semiconductor circuits while maintaining the k value.

In accordance with the objects of the present invention a new method of forming air gaps between adjacent conducting lines of a semiconductor circuit is achieved.

A pattern of (disposable) photo resist is deposited using reverse metal masking followed by a blanket deposition of metal across and in between the photo resist pattern. This metal can be deposited by electroplating, electroless plating, etc. Chemical Mechanical Planarization (CMP) is applied to the deposited metal layer to planarize the top surface of the deposited metal down to the top of the previously deposited photo resist pattern. A pattern of low dielectric constant (k) material is deposited on top of the planarized surface using a dummy deposition mask, the dielectric material is etched. If necessary, a barrier can be deposited (of for instance SiN) prior to the deposition of the low k dielectric. The previously deposited pattern of photo resist is removed leaving air gaps between the metal lines and leaving the pattern of deposited low k dielectric material in place. An Inter Level Dielectric (ILD) layer is deposited by a high pressure plasma enhanced CVD process and is supported by the previously deposited pattern of low dielectric constant material thus forming a layer across the deposited metal leads without penetrating into the openings or air gaps that exist between these metal leads. The gaps between the conducting leads remain thus filled with air establishing a very low dielectric constant between the conducting leads. A layer of low dielectric constant material is deposited on top of the formed intra-level layer to form a low k inter-level dielectric.

The formation of the inter-level dielectric layer within the scope of the present invention further enables the removal of dummy blocks or patterns. These dummy blocks are added to the regular pattern of a semiconductor circuit design in order to improve and facilitate the step of planarization of surfaces. The inter-level dielectric layer of the present invention provides and facilitates the planarization process thus enabling the reduction or elimination of the dummy pattern. The inter-level dielectric layer of the present invention can further enable the addition of dummy blocks to facilitate planarization while at the same time maintaining the k value.

DETAILED DESCRIPTION OF THE PREFERRED EMBODIMENT

The making and use of the presently preferred embodiment of the present invention is discussed below. However, it should be appreciated that the present invention provides many applicable inventive concepts that can be combined with a variety of specific contexts. The specific embodiment discussed here is merely illustrative of specific ways to make and use the present invention and does not delimit the scope of the invention.

Referring now more specifically to FIG. 11 there is shown a cross-sectional view of a substrate 14 on which a photo resist (PR) pattern 12 has been deposited. This pattern 12 is the mirror image of the pattern of metal lines that is to be established on top of the substrate 14 and is deposited using reverse metal masking. This process is within the state of the art of semiconductor manufacturing. The substrate 14 is, preferably, made of silicon, which is typically single crystalline. The substrate 14 can also be made of epitaxial formations, germanium silicon, silicon on insulator material and/or similar substrate materials. A base layer 16 has been deposited over the substrate 14 and contains silicon dioxide. The base layer can also contain other dielectric materials and is indicative that the construct of the present invention can be applied at any level within the fabrication of a semiconductor without being limited to formation directly on the surface of a wafer.

Figure 1:
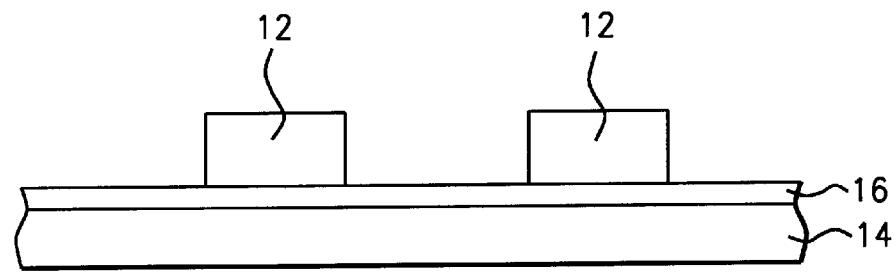
FIG. 1 shows the deposited pattern of photo resist.
Figure 2:
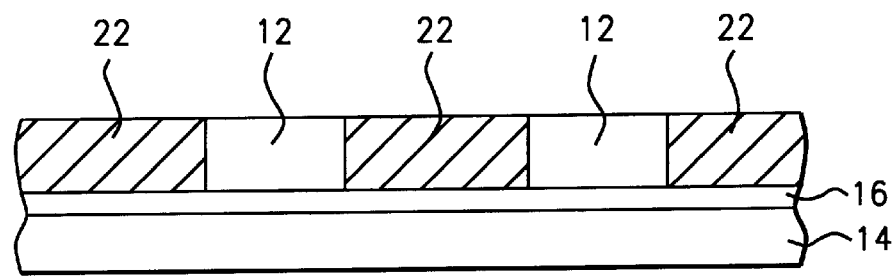
FIG. 2 shows the deposited metal lines between the pattern of photo resist.

FIG. 2 shows the pattern of conductive lines 22 after deposition onto the photo resist pattern 12 and the surface of the wafer 14 and after the completion of CMP up to the top of the resist, if required. The metal deposition that is part of this processing step is a low temperature (below 250 degrees C.) metal deposition. This cold metal deposition can for instance be a deposition of Al approximately 200 degrees C. Copper can be deposited by electro-plating or electroless-plating. In the preferred form, the regions 22 are conductive material, a suitable material includes Al or any other semiconductor compatible conductive layer. This cross-section can indicate any level of conducting lines 22 that needs to be isolated and is etched in a predetermined pattern to form metal leads.

The metal is deposited under conditions of low temperature to prevent the resist from burning off, to reduce the thermal budget, to prevent the degradation of transistor performance if the transistors already exist and to assure that the low k value is maintained at a constant low value.

Figure 3A:
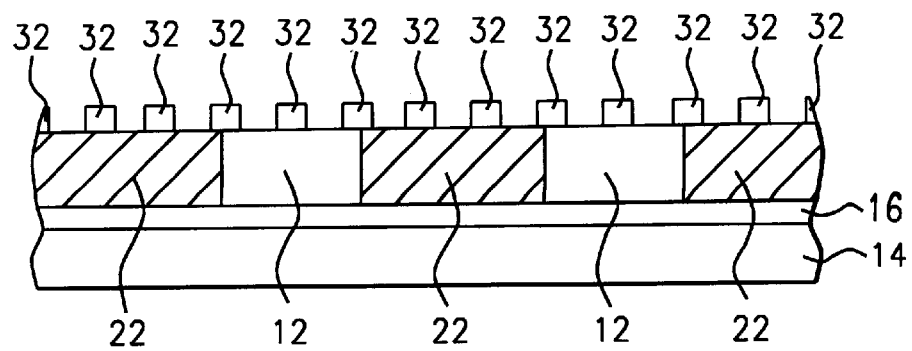
FIG. 3 shows the formation of a pattern of low k dielectric formed on top of the pattern of photo resist and metal lines.
Figure 3B:
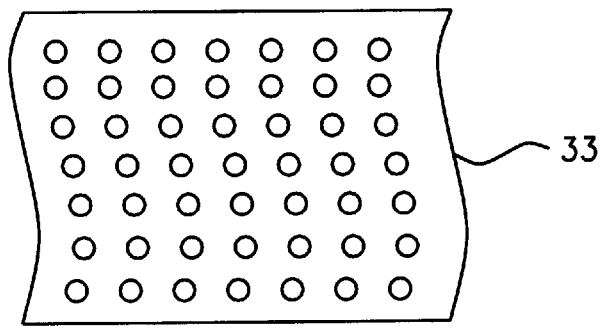

FIG. 3a shows the pattern 32 formed by using the dummy deposition mask 33 shown in FIG. 3b. Pattern 32 is formed using a low dielectric constant material, such as hydrogen silsesquioxane (HSG). Pattern 32 is formed using any of the existing deposition method, for instance high speed spin on. The essence of the dummy dielectric deposition mask 33 is that it has a dense array of holes, this high hole or opening density is required in order to make the subsequent processing step possible. To further enhance the low k film's mechanical strength, UV curing, E-beam curing or thermal curing can be used to outgas the solvent.

For the use of mask 33 no alignment to previous layers is needed, the mask is applicable to any layer of metal. The mask can be formed by using a simple phase shift mask since the mask has a regular pattern. The spacing between the openings in the mask must be such that the spacing of the opening is smaller than the metal line pitch in the design rule. For the 0.18 design rule the metal to metal spacing is 0.26 um, for the 0.25 design rule the metal to metal spacing is 0.36 um.

Figure 4:
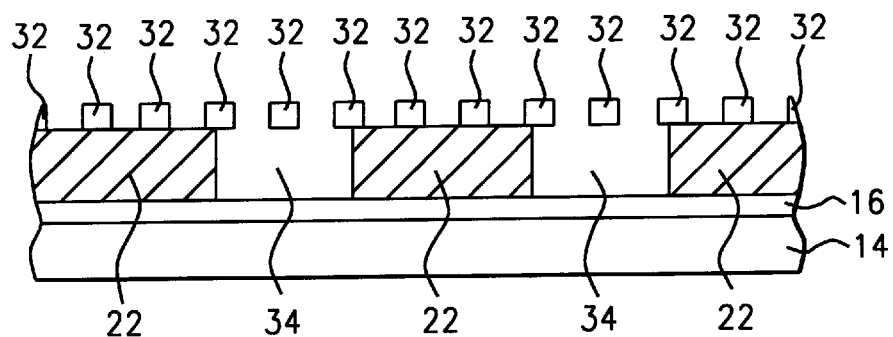
FIG. 4 shows after the removal of the photo resist.

FIG. 4 shows cross sectional view after the photo resist material 12 has been removed. The removal of the photo resist can be accomplished by for instance using a photo-resist strip process using $O_2$ plasma. It is noteworthy to observe that the previously deposited low k dielectric pattern 32 that was deposited on top of the conducting lines 22 remains in place. After the removal of the photo resist 12 the inter-metal spaces 34 are now filled with air.

Figure 5:
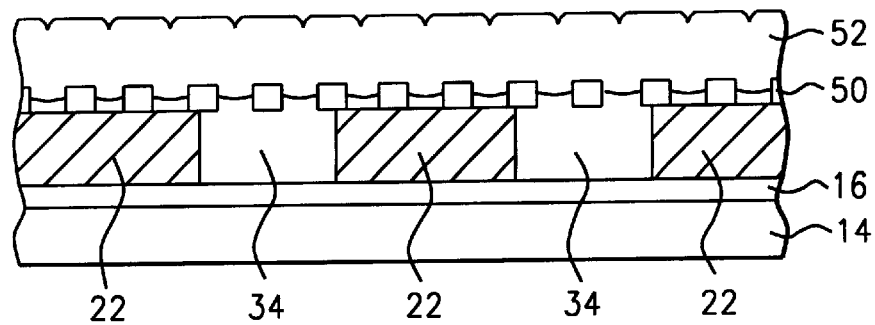
FIG. 5 shows the formation of the inter-level layer and the intra-level air gaps.

FIG. 5 shows the final processing step within the scope of this invention. A inter-level layer 50, consisting of a low dielectric (if necessary) constant material, is created by means of high pressure or high temperature fast reflow CVD deposition where the high pressure and/or high temperature assure that the deposited low k dielectric material adheres to and rapidly builds up between the previously deposited pattern 32 of low k dielectric material. This deposition process closes up the openings between the low k dielectric pattern 32. This inter-level layer 50 forms the base or foundation for the final deposition 52 of $SiO_2$ on top of this base layer 50. However, low k dielectric materials can be deposited at this time if it is required to minimize the CR delay. This latter deposition 52, also referred to as the inter-level dielectric, forms a layer of dielectric material supper-imposed and overlaying the deposited metal lines 22 and incorporating the previously deposited low k dielectric pattern 32. The gaps or spaces 34 between the conducting lines are filled with air thus establishing a construction with very low dielectric constant between the conducting lines 22.

The preferred process for sealing up spaces 32v is a high pressure PECVD dielectric deposition. The processing temperatures are between 350 and 450 degrees C. with a pressure of between 10 and 200 Torr. The high pressure accelerates the sealing of the gap. $SiH_4$ gas is to be used as the precursor because of low cost and better sealing capability than TEOS.

While the present invention has been described with reference to an illustrative embodiment, this description is not to be construed in a limiting sense. Various modifications and combinations, as well as other embodiments of the invention reference to the description. It is therefore intended that the appended claims encompass any such modifications or embodiments.

What is claimed is:

1. A method for forming a physical structure, comprising:

securing a semiconductor substrate in which a base layer is formed;

forming a pattern of photo resist on top of said semiconductor substrate said pattern being the mirror image of the desired conducting line pattern on top of said semiconductor substrate thereby forming an intra-level pattern of photoresist;

forming said desired conducting line pattern said desired conducting line pattern being formed within the spaces or holes within said intra-level pattern of photoresist said desired conducting line pattern further being within the plane of said intra-level pattern of photoresist thereby forming a layer of conducting line pattern and intra-level pattern of photoresist;

planarizing the top surface of said layer of conducting line pattern and intra-level pattern of photoresist;

forming a high density pattern of low dielectric constant material overlaying said layer of conducting line pattern and intra-level pattern of photoresist;

forming intra-level air gaps within said layer of conducting line pattern and intra-level pattern of photoresist thereby forming a layer of conducting line pattern and intra-level air gaps;

closing the gaps within said high density pattern of low dielectric constant material to form a low dielectric constant layer on top of said layer of conducting line pattern and intra-level air gaps; and depositing an inter-level dielectric on top of said low dielectric constant layer.

2. The method of claim 1 wherein forming a pattern of photo resist on top of said semiconductor substrate uses conventional deposition and etching techniques.

3. The method of claim 1 wherein forming said desired conducting line pattern uses conventional deposition and planarization techniques.

4. The method of claim 1 wherein said forming said desired conducting line pattern is electroplating deposition of copper.

5. The method of claim 1 wherein said forming said desired conducting line pattern is electroless plating deposition of copper.

6. The method of claim 1 wherein said forming said desired conducting line pattern is cold-metal deposition of aluminum said deposition to occur at a temperature within the range of between 150 and 200 degrees C.

7. The method of claim 1 wherein said forming said desired conducting line pattern is cold-metal deposition of copper said deposition to occur at a temperature within the range of between 150 and 200 degrees C.

8. The method of claim 1 wherein forming a high density pattern of low dielectric constant material overlaying said plane of said layer of conducting line pattern and intra-level pattern of photoresist is:

securing a dummy mask that exhibits a pattern of openings;

positioning said dummy mask such that said dummy mask partially blocks the top surface of said layer of conducting line pattern and intra-level pattern of photoresist from exposure to a source of material deposition;

exposing said top surface to a low k dielectric material such that said mask partially intercepts the deposition of the low k dielectric material on top of said layer of conducting line pattern and intra-level pattern of photoresist thereby forming a low-k high density dielectric pattern on the surface of said layer of conducting line pattern and intra-level pattern of photoresist; and etching said low-k high density dielectric pattern thereby forming a high density pattern of low dielectric constant material on said surface of said layer of conducting line pattern and intra-level pattern of photoresist.

9. The method of claim 1 wherein forming intra-level air gaps within said layer of conducting line pattern and intra-level pattern of photoresist is removing said intra-level pattern of photo resist using conventional photo strip techniques.

10. The method of claim 1 wherein closing the gaps within said high density pattern of low dielectric constant material is a high pressure Plasma Enhanced CVD (PECVD) dielectric deposition using a processing temperature within the range of between 350 and 450 degrees C. and a pressure within the range of between 10 and 200 Torr thereby using $SiH_4$ as a precursor gas.

11. The method of claim 1 wherein depositing a inter-level dielectric on top of said high density pattern of low dielectric constant layer is a high temperature fast reflow CVD deposition of $SiO_2$.

12. The method of claim 1 wherein depositing a inter-level dielectric on top of said high density pattern of low dielectric constant layer is a high temperature fast reflow CVD deposition of a low k dielectric thereby minimizing RC delay.

13. The method of claim 1 with the additional step of depositing a barrier layer containing SiN said step to occur prior to said step of forming a high-density pattern of low dielectric constant material.

14. The method of claim 1 with the additional step of curing said high density pattern of low dielectric constant material thereby outgassing the solvent thereby enhancing the mechanical strength of said high density pattern of low dielectric constant material said step to be performed prior to said step of forming intra-level air gaps.

15. The method of claim 14 whereby said curing is thermally curing.

16. The method of claim 14 whereby said curing is E-beam curing.

17. The method of claim 14 whereby said curing is UV curing.

18. The method of claim 8 wherein said dummy mask exhibits spacing said spacing between the openings within said mask to be smaller than the pitch in the design rule for the conducting lines within said desired conducting line pattern.

19. The method of claim 18 wherein said design rule is the 0.18 design rule with metal to metal spacing of 0.26 um.

20. The method of claim 18 wherein said design rule is the 0.25 design rule with metal to metal spacing of 0.36 um.

21. A method for forming air gaps between conducting lines of a semiconductor device, comprising the steps of:

securing a semiconductor substrate in which a base layer is formed;

depositing a photo resist layer on said base layer;

etching said photo resist layer into a photo resist pattern that is the mirror image of the pattern of the metal leads that are to be formed on top of said substrate base layer, said photo resist pattern having tops and sidewalls with a spacing or gap between said photo resist pattern, wherein portions of said substrate base are being exposed in the areas of said gaps between said photo resist pattern;

depositing a metal layer on top of said photo resist pattern and on top of said exposed portions of said substrate base;

planarizing said metal layer down to the level of the top of said deposited photo resist pattern thereby obtaining a top surface of said pattern of photo resist and of conducting lines within said pattern of photo resist;

securing a dummy mask that exhibits a pattern of openings;

positioning said dummy mask such that said dummy mask partially blocks said top surface from exposure to a source of material deposition;

depositing low k dielectric material on top of said top surface such that said mask partially intercepts the deposition of the low k dielectric material thereby forming a pattern of low-k high density dielectric material on said top surface;

removing said deposited photo resist pattern thereby forming intra-level air gaps in the plane of said conducting lines;

closing the openings within said pattern of low-k high density dielectric material thus forming a low-k intra-level dielectric base layer; and depositing a layer of low k dielectric material on top of said low k intra-level dielectric thereby forming a low-k interlevel dielectric layer.

22. The method of claim 21 further comprising the step of forming a passivating layer on the sides of said photo resist, after said step of etching said photo resist layer in a pattern to form a photo resist pattern.

23. The method of claim 21 further comprising the step of forming a passivating layer between said photo resist pattern and on top of said exposed portion of said substrate base layer in addition to a passivating layer on the sidewalls of said photo resist pattern, after said step of etching said photo resist pattern in a pattern that is the mirror image of the pattern of the to form conductive leads.

24. The method of claim 21 further comprising the step of depositing a structural dielectric layer, after said step of removing said photo resist.

25. The method of claim 21 wherein said base layer has been deposited over the substrate.

26. The method of claim 21 wherein said base layer has been deposited over the substrate and contains dielectric material.

27. The method of claim 21 wherein said step of depositing a low k dielectric material on top of said top surface is a high speed spin on process using hydrogen silsesquioxane as dielectric material.

28. The method of claim 21 wherein said low k dielectric material comprises $SiO_2$, formed from a $SiH_4$ source in a plasma enhanced vapor deposition chamber at approximately 375 degrees C. as dielectric material.

29. The method of claim 21 wherein said removal of photoresist consists of an oxygen based plasma removal process.

30. The method of claim 21 wherein said step of closing the openings within said pattern of low-k high density dielectric material is a high pressure PECVD dielectric deposition using a processing temperature within the range of between 350 and 450 degrees C. and a pressure within the range of between 10 and 200 Torr thereby using $SiH_4$ as a precursor gas.

31. The method of claim 21 wherein said step of closing the openings within said pattern of low-k high density dielectric material is a combined high pressure high temperature CVD deposition process.

32. The method of claim 21 wherein said depositing said desired conducting line pattern is cold-metal deposition of aluminum said deposition to occur at a temperature within the range of between 150 and 200 degrees C.

33. The method of claim 21 wherein said depositing said desired conducting line pattern is cold-metal deposition of copper said deposition to occur at a temperature within the range of between 150 and 200 degrees C.

34. The method of claim 21 wherein depositing a inter level dielectric on top of said low-k high-density dielectric material is a high temperature fast reflow CVD deposition of $SiO_2$.

35. The method of claim 21 wherein depositing a inter level dielectric on top of said low dielectric constant layer is a high temperature fast reflow CVD deposition of a low k dielectric thereby minimizing RC delay.

36. The method of claim 21 with the additional step of depositing a barrier layer containing SiN said step to occur prior to said step of securing a dummy mask.

37. The method of claim 21 with the additional step of curing said pattern of low-k high density dielectric material thereby outgassing the solvent thereby enhancing the mechanical strength of said pattern of low-k high density dielectric material said step to be performed prior to said step of removing said photoresist pattern.

38. The method of claim 21 wherein said dummy mask exhibits spacing said spacing between the openings within said mask to be smaller than the pitch in the design rule for the conducting lines within said desired conducting line pattern.

39. A method for forming air gaps between conducting lines of a semiconductor device, comprising the steps of:

securing a semiconductor substrate in which a base layer is formed;

depositing a metal layer on said base layer;

etching said metal layer into a pattern of conductive leads wherein said conductive leads having tops and sidewalls with a spacing or gap between said conductive leads, wherein portions of said substrate base layer are being exposed in the areas of said gaps between said conductive leads pattern;

depositing a photo resist layer on top of said pattern of conductive leads and on top of said exposed portions of said substrate base;

planarizing said photo resist layer down to the level of the top of said conductive leads thereby obtaining a top surface of said pattern of photo resist and of said conductive leads within said pattern of photo resist;

depositing a layer of low-k high mechanical strength dielectric material on the surface of said pattern of photo resist and conductive leads;

securing a dummy mask that exhibits a pattern of openings;

positioning said dummy mask such that said dummy mask partially blocks said top surface of said pattern of photo resist and conductive leads;

etching said low-k high mechanical strength dielectric material on the surface of said pattern of photo resist and conductive leads such that said mask partially inhibits said etching thereby forming a low-k high density dielectric pattern on top of said surface;

removing said deposited photo resist from said pattern of photo resist and conductive leads thereby forming intra-level air gaps;

closing the openings within said low-k high density dielectric pattern thus forming a low-k inter-level dielectric base layer; and depositing a layer of low k dielectric material on top of said low k inter-level dielectric thereby forming a low-k interlevel dielectric layer.

40. The method of claim 39 further comprising the step of forming a passivating layer on the sides of said metal leads, after said step of etching said metal layer into a pattern to form conductive leads.

41. The method of claim 39 further comprising the step of forming a passivating layer between said conductive leads and on top of said exposed portion of said substrate base layer in addition to a passivating layer on the sidewalls of said conductive leads, after said step of etching said metal layer to form conductive leads.

42. The method of claim 39 further comprising the step of depositing a structural dielectric layer, after said step of removing said photo resist.

43. The method of claim 39 wherein said base layer has been deposited over the substrate.

44. The method of claim 39 wherein said base layer has been deposited over the substrate and contains dielectric materials.

45. The method of claim 39 wherein said step of depositing a low k dielectric material on top of said conductive leads and said photo resist material consists of high speed spin on process using hydrogen silsesquioxane as dielectric material.

46. The method of claim 39 wherein said low-k high mechanical strength dielectric material comprises $SiO_2$, formed from a $SiH_4$ source in a plasma enhanced vapor deposition chamber at approximately 375 degrees C. as dielectric material.

47. The method of claim 39 wherein said removal of photoresist consists of a silicide based plasma removal process.

48. The method of claim 39 wherein said removal of photoresist consists of an oxide based plasma removal process.

49. The method of claim 39 wherein said step of closing the openings within said high dot density low k dielectric pattern consists of a high temperature CVD deposition process.

50. The method of claim 39 wherein closing the gaps within said high density pattern of low dielectric constant material is a high pressure Plasma Enhanced CVD (PECVD) dielectric deposition using a processing temperature within the range of between 350 and 450 degrees C. and a pressure within the range of between 10 and 200 Torr thereby using $SiH_4$ as a precursor gas.

51. The method of claim 39 wherein said depositing a layer of low k dielectric material on top of said low-k inter-level dielectric base layer is a high temperature fast reflow CVD deposition of $SiO_2$.

52. The method of claim 39 with the additional step of depositing a barrier layer containing SiN said step to occur prior to said step of depositing a layer of low-k high mechanical strength dielectric material on the surface of said pattern of photo resist and conductive leads.

53. The method of claim 39 with the additional step of curing said pattern of low-k high mechanical strength dielectric material thereby outgassing the solvent thereby enhancing the mechanical strength of said low-k high mechanical strength dielectric material said step to be performed prior to said step removing said deposited photo resist from said pattern of photo resist and conductive leads.

54. The method of claim 39 wherein said dummy mask exhibits spacing said spacing between the openings within said mask to be smaller than the pitch in the design rule for the conducting lines within said desired conducting line pattern.

* * * * *